US008043703B2

(12) United States Patent
Cornie et al.

(10) Patent No.: US 8,043,703 B2
(45) Date of Patent: Oct. 25, 2011

(54) THERMALLY CONDUCTIVE GRAPHITE REINFORCED ALLOYS

(75) Inventors: James A. Cornie, Cambridge, MA (US); Mark Montesano, Head of Harbor, NY (US); Stephen S. Cornie, Watertown, MA (US); Himanshu Pokharna, Santa Clara, CA (US)

(73) Assignee: Metal Matrix Cast Composites LLC, Waltham, MA (US)

( * ) Notice: Subject to any disclaimer, the term of this patent is extended or adjusted under 35 U.S.C. 154(b) by 549 days.

(21) Appl. No.: 11/900,727

(22) Filed: Sep. 13, 2007

(65) Prior Publication Data

US 2009/0075120 A1    Mar. 19, 2009

(51) Int. Cl.
*B32B 9/00* (2006.01)
(52) U.S. Cl. ..................................... 428/408; 428/293.4
(58) Field of Classification Search .......................... None
See application file for complete search history.

(56) References Cited

U.S. PATENT DOCUMENTS

| 5,228,494 A | 7/1993 | Rohatgi et al. |
| 5,296,310 A | 3/1994 | Kibler et al. |
| 5,437,921 A | 8/1995 | Kogo et al. |
| 6,003,221 A | 12/1999 | Sawtell et al. |
| 6,148,899 A | 11/2000 | Cornie et al. |
| 6,727,585 B2 | 4/2004 | Choi |
| 6,884,522 B2 | 4/2005 | Adams et al. |
| 6,927,421 B2 | 8/2005 | Ishikawa et al. |
| 6,933,531 B1 | 8/2005 | Ishikawa et al. |
| 2003/0164206 A1 | 9/2003 | Cornie et al. |
| 2005/0253770 A1 | 11/2005 | Edward et al. |
| 2006/0086434 A1 | 4/2006 | Cornie et al. |
| 2006/0266496 A1 | 11/2006 | Edward et al. |

FOREIGN PATENT DOCUMENTS

| EP | 0370546 A1 | 5/1990 |
| EP | 0765946 A1 | 4/1997 |
| EP | 1168438 A2 | 1/2002 |
| ES | 2304314 A1 | 3/2007 |
| WO | 2008/116947 A1 | 10/2008 |

OTHER PUBLICATIONS

Prieto, et al., Fabrication and Properties of Graphite Flakes/Metal Composites for Thermal Management Applications, ScienceDirect, Jan. 8, 2008, pp. 11-14, vol. 59, Elsevier.

(Continued)

*Primary Examiner* — Timothy Speer
(74) *Attorney, Agent, or Firm* — Kurt Rauschenbach; Rauschenbach Patent Law Group, LLP (57) ABSTRACT

Embodiments of the present invention provide composite bodies having a discontinuous graphite preform and at least one silicon-bearing metal alloy infiltrant. Embodiments of the present invention also provide methods for producing such composite bodies. The metal alloy is preferably comprised of aluminum, copper, or magnesium, or combinations thereof. Certain preferred embodiments provide at least one aluminum alloy having from about 5% silicon to about 30% silicon, more preferably from about 11% to about 13% silicon, as an alloying element. Certain presently preferred embodiments provide an aluminum-silicon eutectic composition having about 12.5% silicon. Embodiments of the invention provide composite materials be "tuned" to more closely match thermal expansion characteristics of a number of semiconductor or integrated circuit materials such as, but not limited to, silicon, alumina, aluminum nitride, gallium nitride, and gallium arsenide while also providing high thermal conductivity. Embodiments of the present invention are especially suited for use as a heat sink, a heat spreader, or both.

34 Claims, 9 Drawing Sheets

OTHER PUBLICATIONS

"Notification Concerning Transmittal of International Preliminary Report on Patentability (Chapter I of the Patent Cooperation Treaty)" for PCT/US2008/010666, The International Bureau of WIPO, Mar. 25, 2010, 8 pages, The International Bureau of WIPO, Geneva, Switzerland.

Cornie, et al., Hybrid Metal Matrix Composite Structures With Highly Conductive Thermal Pyrolytic Graphite Inserts, U.S. Appl. No. 60/639,974, filed: Dec. 29, 2004.

Saums, et al., Implementation of Diamond Pins as Thermal Vias for High Heat Flux Spreading in Cite-Compatible Lids and Substrates for Semiconductor Packaging, pp. 1-3.

Cornie, et al., Hybrid Metal Matrix Composite Packages With High Thermal Conductivity Inserts, U.S. Appl. No. 11/306,343, filed: Dec. 23, 2005.

Devincent, S.M., et al., Improvement of Thermal and Mechanical Properties of Graphite/Copper Composites Through Interfacial Modification, Journal of Materials Engineering and Performance, Jun. 1993, pp. 323-331.

Landry, K. et al., Wettability of Carbon by Aluminun and Aluminun Alloys', Materials Science and Engineering A., Oct. 15, 1998, pp. 99-111, vol. A254.

Rodriguez-Guerrero, A, et al., Pressure Infiltration of Al-12wt.%Si-X(X+Cu, Ti, Mg) Alloys Into Graphite Particle Preform, Acta Materialia, Feb. 13, 2006, pp. 1821-1831, vol. 54.

"Notification of Transmittal of the International Search Report and the Written Opinion of the International Searching Authority, or the Declaration" for International Patent Application No. PCT/US2008/010666, Apr. 13, 2009, pp. 1-14, Korean Intellectual Property Office, Daejeon, Republic of Korea.

THERMALLY CONDUCTIVE GRAPHITE REINFORCED ALLOYS

GOVERNMENT RIGHTS

Research relating the present patent application was supported, in part, by the National Science Foundation under Grant No 0638035. The government may have certain rights in the claimed inventions.

FIELD OF THE INVENTION

The present invention generally relates to composite materials having a discontinuous graphite phase in a metal alloy matrix, and methods for producing same.

BACKGROUND

Ever increasing complexity, power consumption, computing prowess, and functionality of modern microelectronic devices have dramatically increased the demands on the integrated circuits and semiconductor structures incorporated within these devices. Indeed, modern microelectronic devices having advanced semiconductor elements, such as cellular phones and portable music players, generally must dissipate a great amount of heat during operation in order to remain within acceptable operating parameters. As device size decreases, it becomes increasingly important to adequately dissipate heat from the device elements. These microelectronic devices typically incorporate at least one thermal interface device, such as a heat sink, in order to absorb and dissipate heat, thereby reducing the thermal load on the device elements.

Common device elements often include ceramic components made of silicon carbide, aluminum oxide, aluminum nitride, gallium nitride, gallium arsenide, or beryllium oxide. These elements often include a heat sink in order to dissipate heat generated during operation. As semiconductor and integrated circuit complexity increases, while physical size decreases, heat generated by these at least now state-of-the-art microelectronic device elements will also increase.

Conventional heat sinks are commonly fabricated from metals such as aluminum, copper, molybdenum, or tungsten. Metals such as copper or aluminum, while often having high thermal conductivity, also have undesirably high coefficients of thermal expansion. Such high coefficients of thermal expansion often mismatch with the underlying, or associated, device element's coefficient of thermal expansion which can lead to increased mechanical stress while under static or cyclic thermal loading. The differential expansion of the heat sink relative to the underlying, or associated, element can cause cracking, or other failure. Some metals such as tungsten and molybdenum, while having relatively low coefficients of thermal expansion, unfortunately exhibit lower thermal conductivity and higher density than desired and may not be suitable for certain thermal management applications. Moreover, these traditional heat sink materials are simply proving to be insufficient when challenged with ever increasing electronic device power densities.

Metal matrix composites, generally providing a ceramic-based macrostructure having void volume fraction filled by a molten metal, have been developed as an alternative to metal heat sinks. Still further, these composites may also typically include inorganic fibers as an inorganic filler material to be additionally incorporated within the void volume fraction. These metal matrix composites, nonetheless, also suffer drawbacks. Filler incorporation, for example, may lead to non-uniform distribution due to simple displacement and/or wetting difficulties. It is often, accordingly, difficult to properly manage incorporation and distribution of the filler phase to obtain target properties for the composite. Conventional metal matrix composites also offer limited ability to match the coefficients of thermal expansion with underlying device elements and can also be difficult to fabricate to appropriate size. These conventional metal matrix composites further lack sufficient thermal conductivity to address the growing need for higher levels of thermal dissipation.

Ever-increasing power densities in microelectronic devices have resulted in the need for composite materials to provide improved thermal dissipation for microelectronic device elements. Accordingly, there is a need in the art for lightweight materials having higher thermal conductivities than that offered by traditional materials for higher thermal dissipation while also providing suitable coefficients of thermal expansion that minimize thermal mismatch with associated device elements. There is a further need for methods of producing such composite materials having macrostructure architectures that provide for improved infiltrant incorporation while providing for improved balance between thermal conductivity and thermal expansion properties.

SUMMARY

Certain embodiments of the present invention provide a composite material having a preform made of flake graphite, particulate graphite, or both and at least one metal alloy infiltrant, wherein the infiltrant preferably provides at least near complete preform wetting. The metal alloy is preferably comprised of aluminum, copper, or magnesium, or combinations thereof. Still more preferably, at least one metal alloy includes silicon. Embodiments of the present invention provide at least one aluminum alloy preferably having at least about 5% silicon and up to about 30% silicon as an alloying element, still more preferably from about 11% to about 13% silicon. Certain presently preferred embodiments provide an aluminum-silicon eutectic composition having about 12.5% silicon. Embodiments of the prevention provide composite materials having a coefficient of thermal expansion (CTE) that may be adjusted from about 3 ppm/K to about 12 ppm/K while the in-plane thermal conductivity may be adjusted from about 500 W/mK to about 750 W/mK. Composite materials of the present invention may therefore be "tuned" to match the thermal characteristics of a number of semiconductor or integrated circuit materials such as but not limited to silicon, alumina, aluminum nitride, gallium nitride, and gallium arsenide. Embodiments of the present invention are especially suited for use as a heat sink, a heat spreader, or both.

Methods of producing such composite materials are also provided by certain embodiments of the present invention. These embodiments provide for improved infiltrant-graphite contact by incorporating a third phase material to facilitate capillary channels, e.g. micro-gates, within the graphite preform. Without being limited by theory, it is believed that such capillary action and improved infiltrant/graphite contact effect silicon carbide formation on, or within, at least one graphite surface, preferably all graphite surfaces. Upon solidification, such graphite surface modification is believed to lower the thermal impedance of the graphite-infiltrant interface and facilitate optimal thermal conductivity and thermal expansion of the composite material.

Still further, certain embodiments may grind, or otherwise particularize, the solidified composite material, and press, or otherwise fabricate, those particles into a preform to be further infiltrated with at last one metal alloy, preferably an aluminum-silicon alloy. Embodiments of the present invention may have in-plane thermal conductivity of at least about 200 W/mK to about 1200 W/mK. Certain embodiments of the present inventive method may thus provide composite materials having transverse, e.g., cross-sectional, thermal conductivity of at least 30 W/mK with in-plane thermal conductivity of at least 400 W/mK.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings certain embodiments which are presently preferred. It should be understood, however, that the invention is not limited to the precise arrangements and instrumentalities shown.

DETAILED DESCRIPTION OF THE INVENTION

Certain embodiments of the present invention provide a composite material having a preform made of flake graphite, particulate graphite, or both and at least one metal alloy infiltrant, wherein the infiltrant preferably provides at least near complete preform surface coverage. Still further, graphite may preferably be milled artificial graphite, natural flake graphite, natural vein graphite, or highly graphitized mesophase pitch, or combinations thereof. Metal alloy may include aluminum, copper, or magnesium. Still more preferably at least one metal alloy includes silicon. Embodiments of the present invention provide at least one aluminum alloy preferably having at least about 5% silicon and up to about 30% silicon as an alloying element, more preferably about 11% to about 13% silicon. Certain presently preferred embodiments provide an aluminum-silicon eutectic composition having about 12.5% silicon. Embodiments of the invention provide composite materials having a coefficient of thermal expansion (CTE) that may be adjusted from about 3 ppm/K to about 12 ppm/K while the "in-plane" thermal conductivity adjusted from about 750 W/mK to about 500 W/mK. Composite materials of the present invention are especially suited for use as a heat sink, a heat spreader, or both. As used herein, "in-plane" or "base plane" is understood to mean the X-Y plane or the plane normal to the Z direction in an X-Y-Z coordinate system. It is also understood to mean the plane that is parallel to the bonded surface of a heat sink.

Generally speaking, thermal conductivity of discontinuous reinforced metal matrix composites is expected to be less than theoretical. This is indeed the case for discontinuous graphite fiber reinforced copper and magnesium composite materials. However, when examining the thermal characteristics of discontinuously reinforced aluminum-silicon alloy composites, the "in-plane" thermal conductivity generally agrees with theoretical values calculated using a simplified rule of mixtures method. Without being limited by theory, it is believed that improved transverse, e.g., cross-sectional, and in-plane thermal conductivity of graphite reinforced aluminum alloy and copper alloy composites may be affected by the graphite-metal alloy interface. Crystalline graphite generally has very high thermal conductivity characterized by phononic conduction. Metal thermal conductivity is characterized by electronic conduction. Thus at the interface, a change in conduction modes from phononic to electronic conduction likely takes place and such transition likely results in high interface thermal impedance.

Silica carbide (SiC) also exhibits phononic conduction and is believed to be an appropriate interface material to minimize the high interface thermal impedance. When such a layer is present, the thermal interface resistance is lowered and the thermal conductivity may approximate theoretical rule of mixtures values.

Certain embodiments of the present invention facilitate thermal characteristic "tuning" through variation of at least one of metal alloy infiltrant composition and preform architecture. Certain embodiments of the present invention provide an infiltration process whereby at least one molten silicon-bearing metal alloy is provided to a graphite preform. The metal alloy is preferably comprised of aluminum, copper, or magnesium, or combinations thereof. Silicon, in liquid solution, is allowed to react with the infiltrated graphite surface graphite to form a relatively thin layer of silicon carbide. At infiltration temperatures, diffusion kinetics provide for a SiC layer generally limited to a few nanometers, generally believed to about 0.5 nm to about 10 nm. The silicon carbide layer itself is sufficiently thin as not to contribute appreciable thermal impedance itself.

Methods of producing such composite materials are also provided by embodiments of the present invention. In certain preferred embodiments, a pressure infiltration system is used to provide the silicon-bearing metal alloy to the graphite preform. Since, these metal alloys generally do not wet, or poorly wet, graphite the pressure infiltration system may exert up to 100 atm of pressure to effect at least near complete graphite-infiltrant contact in such traditionally non-wetting systems. These embodiments provide for improved graphite-infiltrant contact by incorporating a third phase material to facilitate capillary channels, e.g. micro-gates, between the graphite surfaces of the preform. Third phase materials may preferably include milled fiber glass, milled graphite fiber, milled carbon fiber, colloidal silica, small diameter ash particulates, small diameter silica, fume silica, sodium silicate, ceramic particles, or combinations thereof. Indeed, such micro-gates allow for use of relatively high infiltration pressures with increased graphite surface area available for infiltrant contact and minimal graphite-graphite surface interaction/contact without undue preform compression. Without being limited by theory, it is believed that such capillary action and improved contact provide enhanced diffusion kinetics to effect silicon carbide formation on, or within, at least one graphite surface. Upon solidification, such graphite surface modification is believed to lower the thermal impedance of the graphite-infiltrant interface and facilitate optimal thermal conductivity and thermal expansion of the composite material.

Still further, the solidified composite material may then be particularized and pressed, or otherwise fabricated, into a preform to be further infiltrated with at last one metal alloy, preferably an aluminum-silicon alloy. Certain embodiments of the present inventive method may thus provide composite materials having transverse, e.g., cross-sectional, thermal conductivity of at least 30 W/mK with "in-plane" thermal conductivity of at least 400 W/mK.

EXAMPLES

Example 1

Graphite was provided having an initial mesophase and graphitized to the equivalent of P-120. The graphite was further provided in discontinuous milled form with an average fiber length of about 300 microns and a thermal conductivity of about 600 W/mK. The graphite fibers were slurry processed and formed into a mat. The preform architecture was designed to have fibers randomly distributed with respect to the base plane with the average angle of declination of the fiber to the base plane being approximately 20 degrees. The mats were compressed to near-planar-isotropic array and compressed to graphite volume fractions varying from 0.3 to 0.55. These preforms were pressure infiltrated with an aluminum silicon alloy (A413 HP—having about 11% to about 13% silicon and about 0.1% to about 0.3% magnesium).

Preforms for these castings were loaded into volume defining molds fitted to the preform size, sealed within a mold vessel, evacuated and heated to evaporate the binder. Once the binder was removed, the mold vessel was heated under vacuum, after which molten aluminum was vacuum transferred into the mold vessel, thus isolating a vacuum within the mold cavities filled with the graphite fiber preforms. The mold vessel was then transferred into an autoclave where it is pressurized to cause all submicron voids within the preform and mold vessel to be infiltrated. The mold vessel is then cooled under pressure and solidified. After cooling, the molds are removed from the steel mold vessel for subsequent evaluation or machining into heat sinks.

Figure 1:
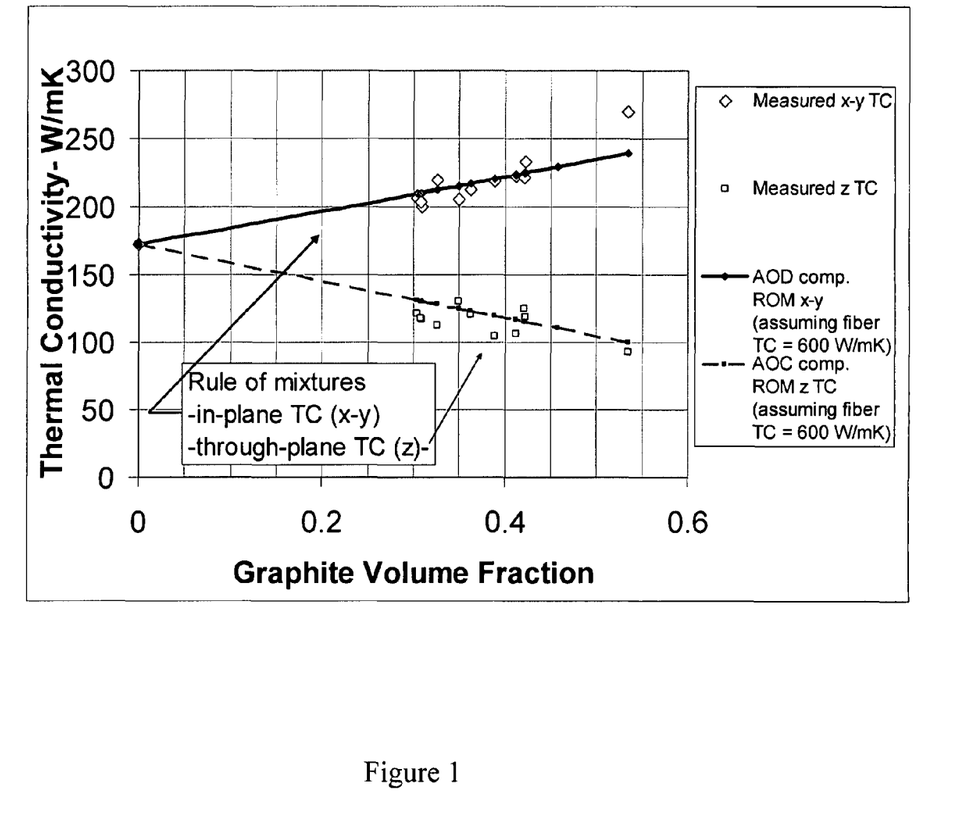
FIG. 1 depicts a graph showing thermal conductivity and thermal expansion of aluminum-silicon alloy infiltrated discontinuous graphite fiber preforms as a function of graphite fiber volume fraction compared to Rule of Mixtures calculations assuming a fiber axial thermal conductivity of 600 W/mK.

FIG. 1 shows the variation in measured in-plane and through plane thermal conductivity for these aluminum alloy infiltrated preforms. Also shown in this figure are Rule of Mixtures (ROM) calculations for in-plane and through plane composites, assuming a fiber thermal conductivity of 600 W/mK and an average initial fiber angle of declination of 20 degrees in the preform prior to compression to the desired graphite volume fraction. These data show that the in-plane thermal conductivity is at least as high as the calculated ROM thermal conductivity and that the through-plane thermal conductivity is only slightly lower than Rule of Mixtures calculations.

Figure 2:
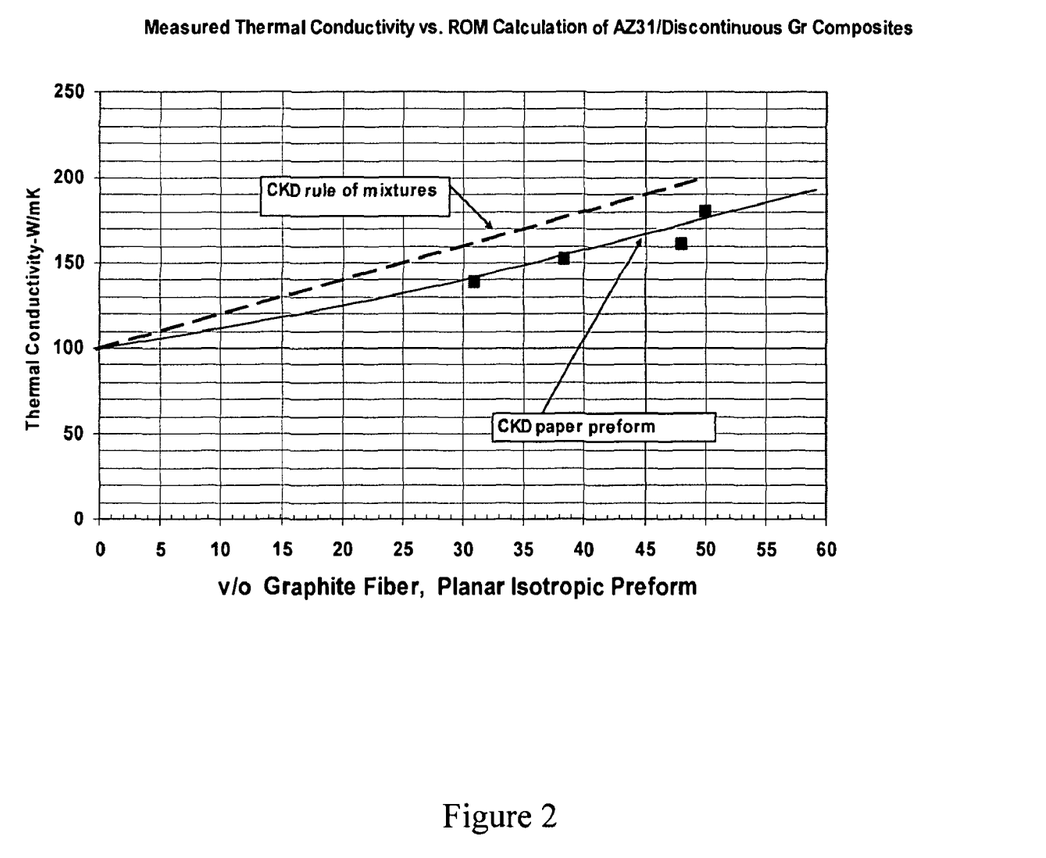
FIG. 2 depicts a graph showing thermal conductivity and thermal expansion of magnesium-aluminum-zinc alloy infiltrated discontinuous graphite fiber preforms as a function of graphite fiber volume fraction compared to Rule of Mixtures calculations assuming a fiber axial thermal conductivity of 600 W/mK.
Figure 3:
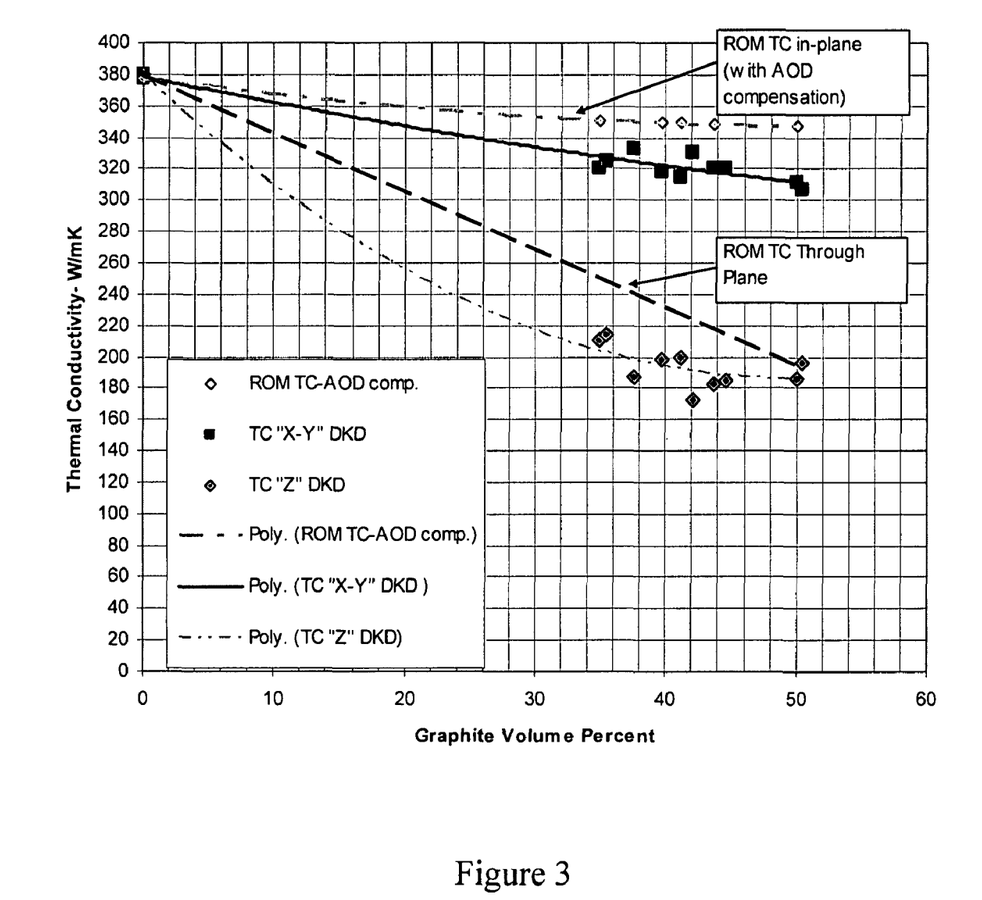
FIG. 3 depicts a graph showing thermal conductivity and thermal expansion of copper-chromium alloy infiltrated discontinuous graphite fiber preforms as a function of graphite fiber volume fraction compared to Rule of Mixtures calculations assuming a fiber axial thermal conductivity of 600 W/mK.

Several other alloys were also provided to the preforms. For example, aluminum alloys having between about 10 to about 14% silicon; copper alloys having about 0.5% to 1% chromium, and a magnesium alloy (AZ31) having about 3% aluminum and about 1% zinc. Infiltrated preforms were solidified and machined into test coupons for CTE and thermal diffusivity testing for thermal conductivity as shown in FIGS. 1, 2, 3. Specifically, FIGS. 1, 2, and 3 provide plots of the thermal conductivity and in-plane thermal expansion coefficient of Al—Si, Cu—Cr and Mg AZ31 respectively.

The results of these experiments generally show that aluminum-silicon alloy infiltrated preforms resulted in at least near theoretical thermal conductivity with minimal evidence of thermal interface resistance. This was most effective in aluminum-alloy composites having about 6% to about 15% silicon in liquid solution. These data imply that the thermal resistance at the graphite-aluminum alloy interface is very low. These results further suggest that minimal thermal impedance interface was exhibited by preforms infiltrated with an eutectic aluminum-silicon alloy.

Figure 4A:
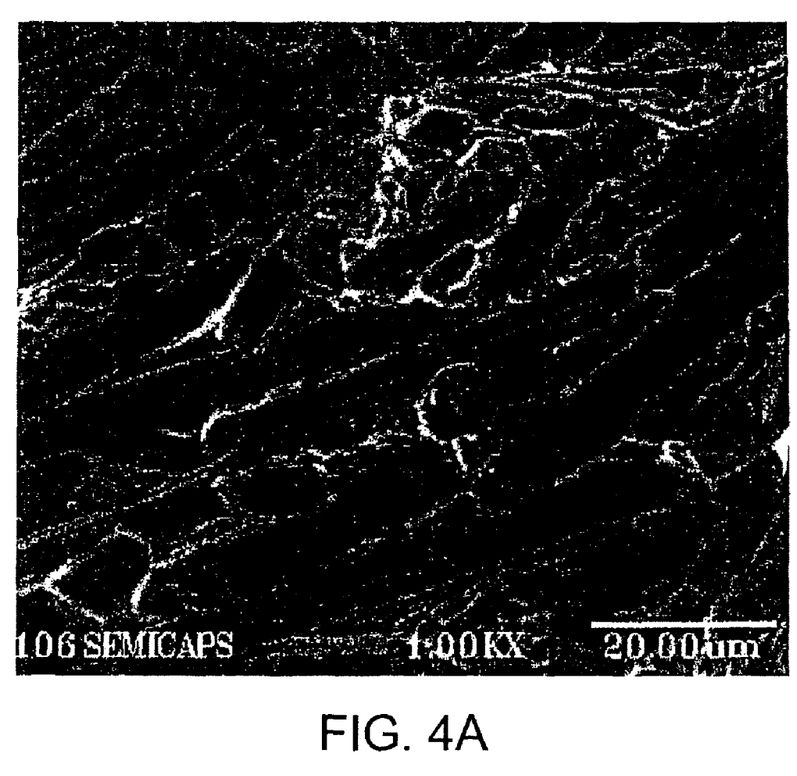
FIG. 4 depicts SEM micrographs of the graphite fiber-infiltrant interface for aluminum-silicon alloy infiltrated preforms.
Figure 4B:
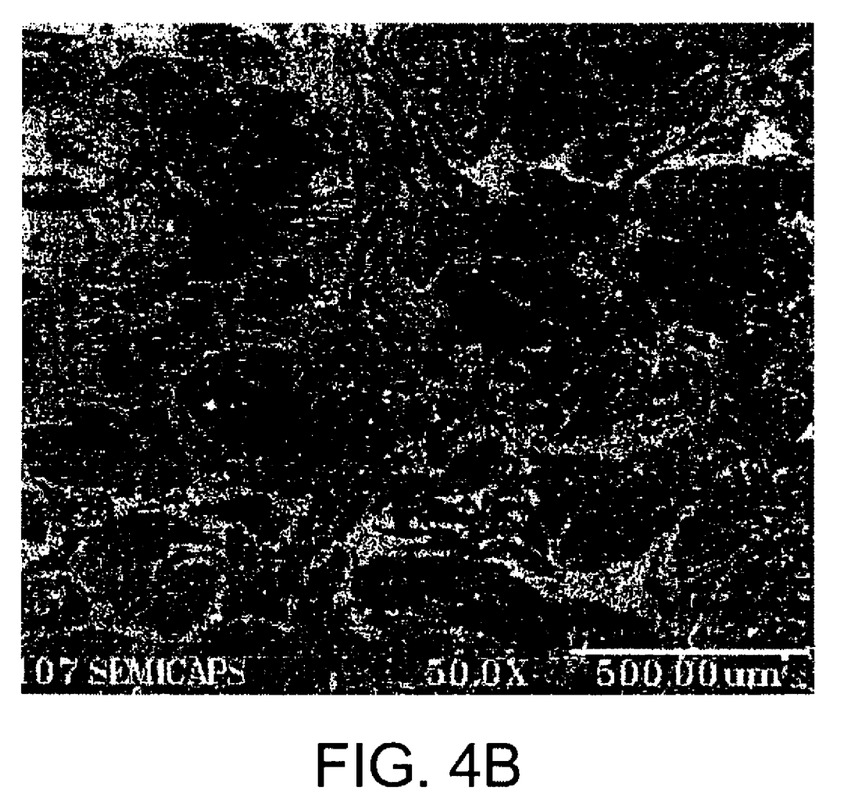

FIG. 4 shows an SEM micrograph from transverse tensile testing indicate that the fiber is strongly bonded to the interface. Indeed, FIG. 4a shows fiber fracture and delamination leaving bonded material connected to the graphite fiber.

Figure 4C:
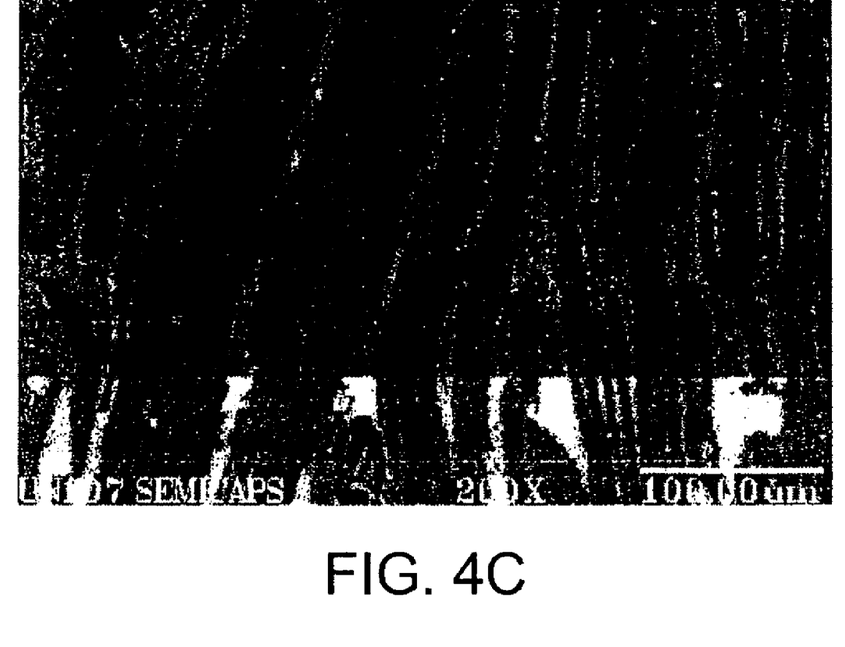

The backscattered SEM image of FIG. 4a further evidences the brighter-shaded infiltrant having substantial contact with the darker-shaded graphite preform. Here, brightness is proportional to atomic number such that Al—Si alloy infiltrant having an atomic number of 13 is brighter than graphite having an atomic number of 6. At the operating infiltration temperatures silicon carbide exhibits relatively low chemical diffusivity and likely produces a layer only a few nanometers thick. As such, there is a interfacial layer of intermediately-bright silicon carbide having an atomic number of 10. FIG. 4c particularly shows a backscattered image taken in the "through plane" direction showing that graphite flakes having graphite-graphite contact and that have not been fully separated. Without being limited by theory, it is believed that use of third phase material inhibiting graphite-graphite contact, and producing micro-gates for metal alloy infiltration, would provide marked improvements in bulk "in-plane" composite thermal conductivity.

Copper alloy infiltrated preforms resulted in reasonable thermal conductivity values, but deviated significantly from theoretical expectations. This is indicative of substantial thermal interface at the graphite-infiltrant interface. Magnesium alloy infiltrated preforms also resulted in acceptable thermal conductivity values but deviated from theoretical expectations; again, indicative of thermal impedance at the graphite-infiltrant interface. Thus, generally speaking those copper alloys and magnesium alloys lacking silicon did not exhibit as marked improvement as silicon bearing aluminum alloys.

Without being limited by theory, it is believed that composite material thermal characteristics are maximized by the formation of a silicon carbide layer at the graphite-infiltrant interface. It is further surmised that while currently exhibited by aluminum-silicon alloys, such an effect may be exhibited by copper-silicon alloys with as much as about 6% silicon in solution or silicon bearing magnesium alloys. Indeed, such unexpected and beneficial results may occur when optimizing the graphite-infiltrant interface. For example, conventional compositions teach that small silicon additions to copper dramatically decreases the thermal conductivity to very low levels. Indeed, a 5% silicon addition would result in a decrease in copper thermal conductivity from approximately 400 W/mK to 30 W/mK.

Infiltrant conductivity may be further mitigated for composite materials having high graphite volume fraction. Natural graphite is highly anisotropic and has a thermal conductivity of approximately 1500 W/mK in plane and approximately 10 W/mK in the transverse direction. An ordered natural graphite preform infiltrated with a copper alloy having 5% silicon and a having near perfect low thermal interface impedance, would be expected to exhibit thermal conductivity of about 1135 W/mK. Hence, graphite properties may predominate at high graphite volume fractions as long as the thermal interface impedance can be properly mitigated. Indeed, the use of highly conductive natural graphite may dominate the general thermal conductivity of the composite material. Thus, in the instant case and counter to conventional teachings, silicon additions may effect improved thermal conductivity. Maximized graphite-infiltrant surface interaction may, still further, greatly influence the extent of thermal characteristic improvement.

Example 2

Generally speaking, the infiltration system must meet a threshold pressure (defined as a function of the infiltration alloy surface energy, preform surface energy, the preform material volume fraction, and preform pore diameter) to effect infiltration. For traditionally non-wetting systems such as molten aluminum-silicon alloy and graphite, very high pressure must be applied to force infiltration. During infiltration, system pressure and graphite volume fraction increase as the effective pore diameter decreases such that higher pressures are required to effect infiltration. At high graphite volume fractions, system pressure compresses the preform substantially closing pores to infiltration; such is the case with natural graphite.

Figure 5:
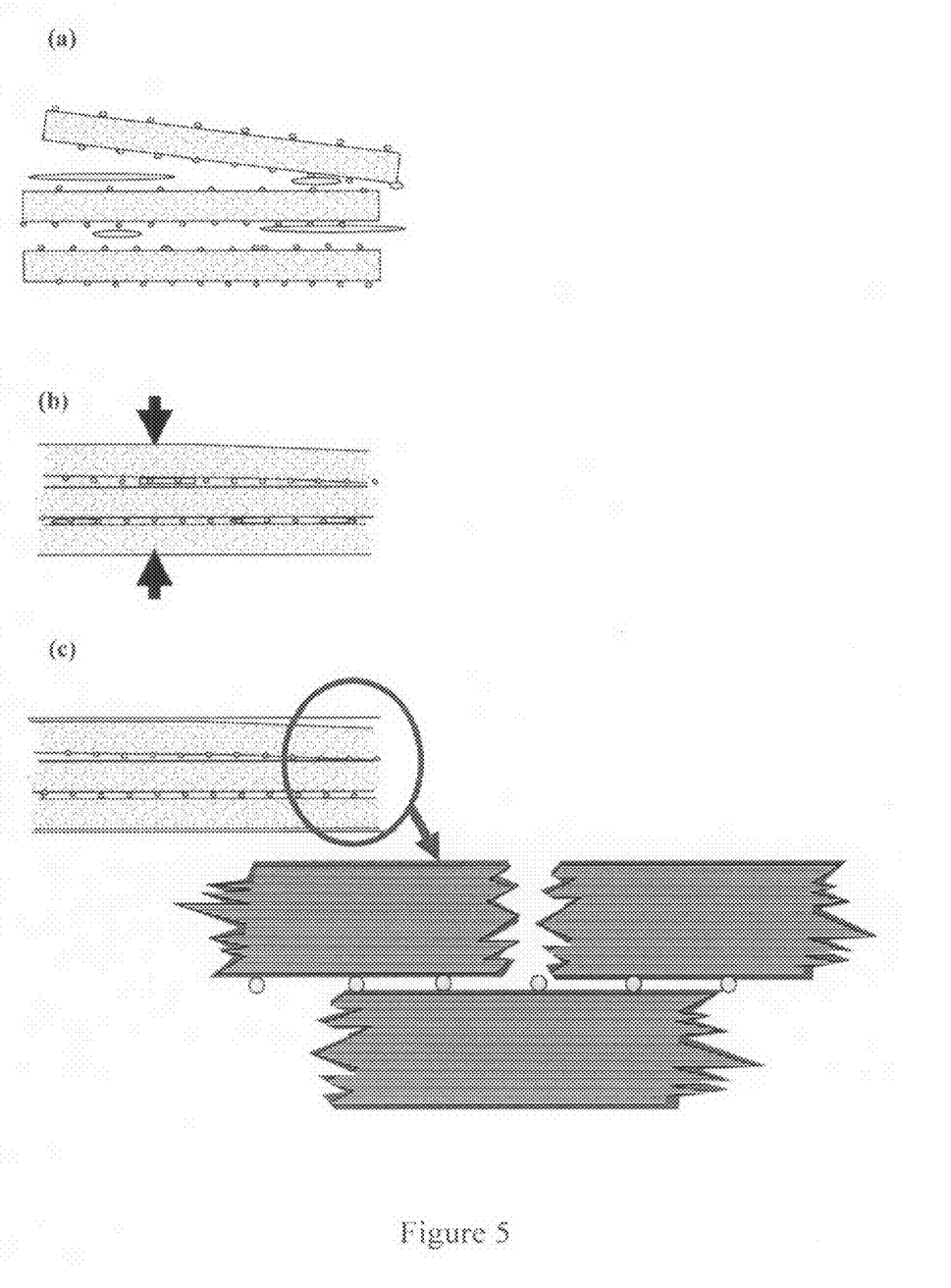
FIG. 5 is a schematic representation of the forming process showing micro-gates for inhibiting graphite-graphite contact and improving graphite-infiltrant contact to effect formation of silicon carbide at the graphite-infiltrant interface.

To provide for a stable preform that resists collapse during pressurization, and to provide for micro-gates to ensure an infiltratable pore structure, at least one third phase material may be added to the preform, alloy, or both. As shown in FIG. 5, these micro-gates inhibit graphite-graphite contact and provide for improved graphite-infiltrant contact to effect formation of silicon carbide at the graphite-infiltrant interface.

Without being limited by theory, it is believed that such capillary action and improved graphite-infiltrant contact effect silicon carbide formation on, or within, at least one graphite surface. Upon solidification, such graphite surface modification is believed to lower the thermal impedance of the graphite-infiltrant interface and facilitate optimal thermal conductivity and thermal expansion of the composite material.

In certain preferred embodiments, a pressure infiltration system is used to provide the silicon-bearing metal alloy to the graphite preform. Since, these metal alloys generally do not, or poorly, wet graphite the pressure infiltration system may exert up to 100 atm of pressure to effect at least near complete infiltrant-graphite contact in such traditionally non-wetting systems. These embodiments provide for improved infiltrant wetting by incorporating a third phase material to facilitate capillary channels, e.g. micro-gates, within the graphite preform. Third phase materials may preferably include milled fiber glass, milled graphite fiber, milled carbon fiber, colloidal silica, small diameter ash particulates, small diameter silica or ceramic particles, or combinations thereof. Indeed, such micro-gates allow for use of relatively high infiltration pressures with increased graphite surface area available for infiltrant contact and minimal graphite-graphite surface interaction/contact.

Preforms of the present invention were generally made in accordance with U.S. Patent Publication No. 2006008634 entitled "Spray Deposition Apparatus and Methods for Metal Matrix Composites" to J. Cornie et al. (incorporated herein by reference). Micro-gating and particle separation improvements, presented herein, have resulted in improvements in thermal conductivity provided by embodiments of the present invention. As described herein, an inorganic material such as milled fiberglass is blended with a highly conductive graphite and pressed to produce a preform having a desired graphite volume fraction. Certain preferred embodiments may be pressed to a graphite volume fraction of about 0.4 to about 0.9, preferably about 0.3 to about 0.62. Certain other embodiments may have a graphite volume fraction of up to 0.75. During aluminum-silicon alloy infiltration, the following reaction is believed to take place:

Analogous reactions are believed to take place for other silicon bearing metal alloys.

Generally speaking, graphite and the third phase material are preferably combined to create an aqueous blend. The graphite material is preferably provided as an aqueous solution, an aqueous slurry, or both, but may also be provided dry. Colloidal silica may be added as an aqueous solution, an aqueous slurry, or both, but may also be provided dry. The blend is then vacuum degassed. Atmospheric gas trapped between the particles expanded upon application of a vacuum and, it is supposed, permit more complete entry of the colloidal silica to the graphite flakes, thus inhibiting re-"booking" of the graphite flakes upon vacuum release. The blend is then provided to a preform mat so that a distribution of graphite is provided to the mat. The blend may be provided by spray deposition, pouring, or any other conventionally known method. The mat is pressed to a create a preform having a desired graphite volume fraction. The preform may then be pressure infiltrated with at least one silicon-bearing alloy to form at least one composite body.

Figure 6:
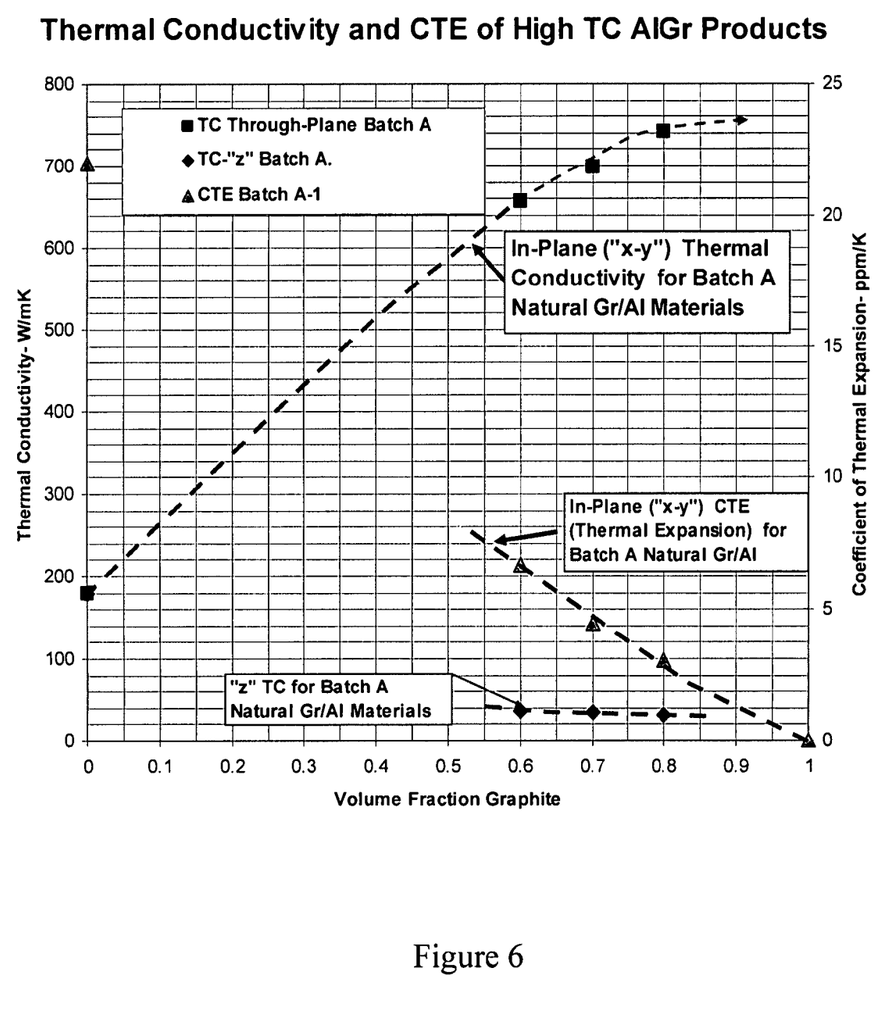
FIG. 6 depicts a graph showing thermal conductivity of aluminum-silicon alloy pressure infiltrated graphite flake preforms having a third phase colloidal silica micro-gating agent.

For example, a charge of a highly conductive graphite flake material was blended in water with 0.2 micron colloidal silica to create a slurry, and vacuum degassed. The blend, under active vacuum, displayed frothing and foaming as entrapped gasses believed to be removed. This lot of material, along with a companion lot of material processed without the added vacuum degassing step, was processed into a 0.75 graphite volume fraction aluminum-silicon alloy infiltrated composites. The resulting materials, after pressure infiltration casting, was machined into steady state thermal conductivity specimens and the thermal conductivity was measured on each specimen. The specimen processed by conventional techniques with 0.2 micron diameter colloidal silica added to graphite displayed a thermal conductivity of 617 W/mK. FIG. 6 shows the thermal properties for such an infiltrated graphite preform having 0.2 micron colloidal silica. The identical blend but processed by vacuum degassing prior to deposition as described above displayed a thermal conductivity of 677 W/mK, a 60 W/mK improvement. Representative metallography, as shown in FIG. 4, suggests that as many as half of the graphite particles have not been separated and thus resist infiltration. Without being limited by theory, it is believed that improved graphite separation, indeed at least near complete separation, would provide markedly improved thermal conductivity.

Figure 7:
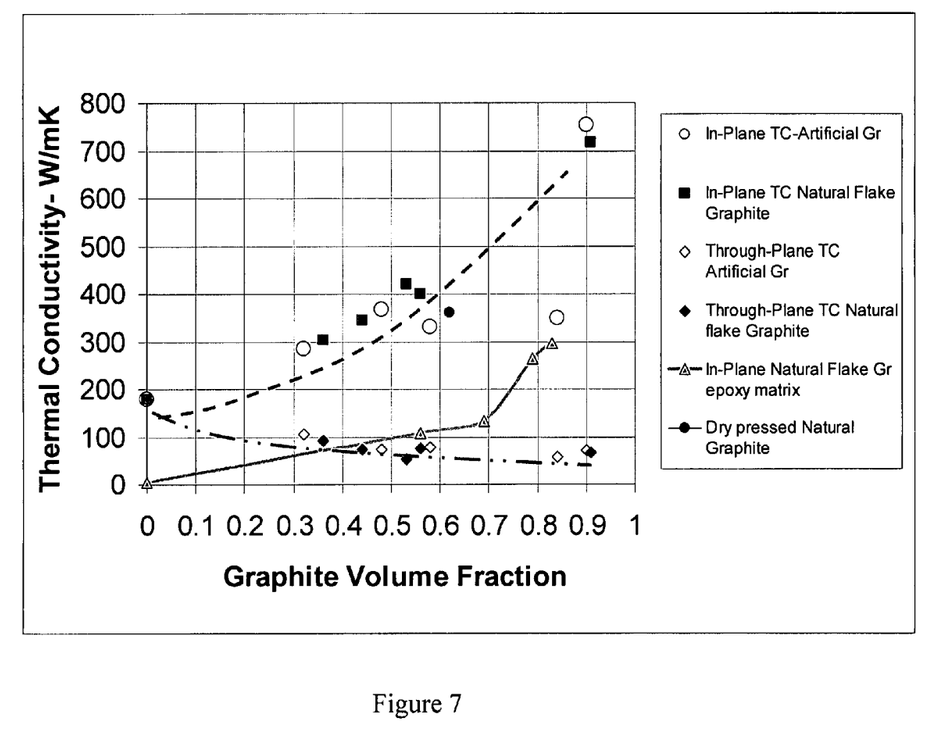
FIG. 7 depicts a graph showing thermal conductivity and thermal expansion of aluminum-silicon alloy pressure infiltrated graphite particulate preforms as a function of graphite volume fraction. The graphite preforms were prepared using a micro-gating process.

The effect of interface impedance is shown in FIG. 7 where A413 HP (an aluminum silicon alloy having about 11% to about 13% silicon and about 0.1% to about 0.3% magnesium) is infiltrated into preforms having natural flake graphite or milled synthetic graphite. These data show that even with imperfectly organized preforms, very high levels of thermal conductivity are achieved with both natural flake graphite and artificial graphite particulates. Also plotted on this figure are data for synthetic particulate graphite with a resin matrix.

These data show that the thermal conductivity of such materials is approximately 350 W/mK less than for the metal infiltrated versions of the same type of material. This indicates a high interface thermal impedance of the resin matrix composites. A further data point of note is a single value at a graphite volume fraction of 0.62 where the thermal conductivity was measured at 362 W/mK. This indicates that the thermal impedance of the graphite to graphite interface is lower than the graphite/resin/graphite interface but still higher than the nearly zero interface impedance resulting from the use of aluminum-silicon alloy.

Embodiments of the present invention further provide lower density composite material suitable for thermal management application For example, the graphite density may range from about 2.15 g/cm$^3$ to about 2.26 g/cm$^3$. Graphite density is significantly less than aluminum (2.7 g/cm$^3$) or copper (8.96 g/cm$^3$). Certain embodiments of the present invention may, therefore, have densities lower than all-aluminum or all-copper heat sinks known in the art. With an aluminum-silicon infiltrant and a graphite volume fraction of about 0.75, an embodiment of the present invention would have a density of approximately 2.36 g/cm$^3$ which is about 13% less dense than aluminum and approximately 74% less dense than copper. With a copper infiltrant and a graphite volume fraction of 0.75, an embodiment would have a density of about 3.94 g/cm$^3$ which is approximately 56% less dense than copper. Certain presently preferred embodiments may have a density tuned from about 2.3 g/cm$^3$ to about 8.0 g/cm$^3$. Thus, as shown herein, certain embodiment of the present invention provide lightweight materials having high thermal conductivities and suitable coefficients of thermal expansion that minimize thermal mismatch.

While the invention has been described in detail and with reference to specific examples thereof, it will be apparent to one skilled in the art that various changes and modifications can be made therein without departing from the spirit and scope thereof.

All references cited are incorporated by reference as if fully set forth herein.

What is claimed is:

1. A composite body comprising a preform having discontinuous flake graphite, discontinuous particulate graphite, or both; a third phase material; and at least one silicon-bearing metal alloy infiltrant comprising about 5% to about 30% silicon in contact with at least one graphite surface wherein said surface further comprises silicon carbide.

2. The composite body of claim 1, wherein said infiltrant comprises about 11% to about 13% silicon.

3. The composite body of claim 1, wherein said infiltrant is selected from the group consisting of aluminum, copper, magnesium, and combinations thereof.

4. The composite body of claim 3, wherein said copper comprises up to about 6% silicon.

5. The composite body of claim 3, wherein said aluminum comprises about 12.5% silicon.

6. A heat sink comprising the composite body of claim 5.

7. A heat spreader comprising the composite body of claim 5.

8. The composite body of claim 3, wherein said aluminum comprises about 6% to about 15% silicon.

9. The composite body of claim 1, wherein said graphite is selected from the group consisting of milled artificial graphite, natural flake graphite, natural vein graphite, highly graphitized mesophase pitch, and combinations thereof.

10. The composite body of claim 1 having a thermal expansion coefficient of at least about 3 ppm/K up to about 12 ppm/K.

11. The composite body of claim 1 having a base plane thermal conductivity of at least about 500 W/mK to about 750 W/mK.

12. The composite body of claim 1 having a base plane thermal conductivity of at least about 200 W/mK to about 1200 W/mK.

13. The composite body of claim 1 having a transverse thermal conductivity of at least 30 W/mK and in-plane thermal conductivity of at least 400 W/mK.

14. The composite body of claim 1 having a mass density of about 2.3 g/cm$^3$ to about 8.0 g/cm$^3$.

15. The composite body of claim 1 wherein the third phase material is selected from the group consisting of milled fiber glass, milled graphite fiber, milled carbon fiber, colloidal silica, ash particulates, ceramic particles, sodium silicate, fume silica, and combinations thereof.

16. The composite body of claim 15 wherein said colloidal silica has an average particle size of about 0.05 to about 0.5 microns.

17. The composite body of claim 15 made by vacuum processing.

18. The composite body of claim 15 having a graphite volume fraction up to about 0.75.

19. The composite body of claim 15 having a graphite volume fraction of about 0.3 to about 0.62.

20. The composite body of claim 15 having a graphite volume fraction of about 0.4 to about 0.90.

21. A heat sink comprising the composite body of claim 15.

22. A heat spreader comprising the composite body of claim 15.

23. A heat sink comprising the composite body of claim 1.

24. A heat spreader comprising the composite body of claim 1.

25. A composite body comprising a preform having:
  discontinuous flake graphite, discontinuous particulate graphite, or both;
  a third phase material selected from the group consisting of milled fiber glass, milled graphite fiber, milled carbon fiber, colloidal silica, ash particulates, ceramic particles, fume silica, sodium silicate, and combinations thereof; and
  at least one silicon-bearing metal alloy infiltrant comprising about 5% to about 30% silicon in contact with at least one graphite surface.

26. The composite body of claim 25 further being resistant to deformation during pressure infiltration.

27. The composite body of claim 25, wherein said graphite is selected from the group consisting of milled artificial graphite, natural flake graphite, natural vein graphite, highly graphitized mesophase pitch, and combinations thereof.

28. The composite body of claim 25, wherein said infiltrant comprises aluminum having about 6 to about 15% silicon.

29. The composite body of claim 25, wherein said infiltrant comprises aluminum having about 5 to about 30% silicon.

30. The composite body of claim 25, wherein said infiltrant comprises aluminum having about 11% to about 13% silicon.

31. The composite body of claim 25, wherein said infiltrant comprises aluminum having about 12.5% silicon.

32. The composite body of claim 25, wherein said infiltrant comprises copper having up to about 6% silicon.

33. The composite body of claim 25 having a graphite volume fraction of about 0.40 to about 0.90.

34. The composite body of claim 25 having a graphite volume fraction of about 0.32 to about 0.62.

* * * * *